US012635257B2

(12) United States Patent
Slaton

(10) Patent No.: US 12,635,257 B2
(45) Date of Patent: May 19, 2026

(54) RESONANCE CANCELLATION DEVICES AND METHODS

(71) Applicant: pSemi Corporation, San Diego, CA (US)

(72) Inventor: Joseph Porter Slaton, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 18/737,822

(22) Filed: Jun. 7, 2024

(65) Prior Publication Data

US 2025/0007508 A1 Jan. 2, 2025

Related U.S. Application Data

(63) Continuation-in-part of application No. 18/343,316, filed on Jun. 28, 2023.

(51) Int. Cl.
| | |
|---|---|
| *H03K 17/687* | (2006.01) |
| *H02H 9/04* | (2006.01) |
| *H03K 17/06* | (2006.01) |
| *H10D 89/60* | (2025.01) |

(52) U.S. Cl.
CPC ........... *H10D 89/811* (2025.01); *H02H 9/046* (2013.01); *H03K 17/063* (2013.01); *H03K 17/687* (2013.01)

(58) Field of Classification Search
CPC .... H02H 9/046; H03K 17/063; H03K 17/687; H10D 89/811
USPC ........... 327/551, 552, 553, 554, 555; 361/56
See application file for complete search history.

(56) References Cited

U.S. PATENT DOCUMENTS

| | | | | |
|---|---|---|---|---|
| 6,597,227 | B1 * | 7/2003 | Yue ......................... | H10D 89/60 |
| | | | | 361/91.1 |
| 8,369,053 | B2 * | 2/2013 | Moronval .............. | H10D 89/60 |
| | | | | 361/111 |
| 8,792,218 | B2 * | 7/2014 | Tsai ........................ | H02H 9/046 |
| | | | | 361/111 |
| 9,917,079 | B2 * | 3/2018 | Tsai ........................ | H02H 9/046 |

(Continued)

FOREIGN PATENT DOCUMENTS

WO      2025/006408  A1      1/2025

OTHER PUBLICATIONS

Invitation to Pay Additional Fees And, Where Applicable, Protest Fee and Partial Search Report issued for International PCT Application No. PCT/US2024/035311 filed on Jun. 24, 2024 on behalf of pSemi Corporation. Mail Date: Oct. 14, 2024. 13 pages.

(Continued)

*Primary Examiner* — William Hernandez
(74) *Attorney, Agent, or Firm* — Steinfl + Bruno LLP

(57) ABSTRACT

Ground impedance may have adverse effects on the performance of RF circuits that employ shunt switches. The disclosed methods and devices address this issue. The methods and devices involve the use of a switch to remove a decoupling capacitor from an RF circuit on an integrated circuit (IC) pin where the storage cap is connected; or modifying the turn-on threshold of an electrostatic discharge protection device (ESD) on the IC pin with the storage cap present to reduce susceptibility to turning on the ESD with the RF signal; or de-Qing the analog and digital core capacitances to minimize their contribution to resonance; or a combination thereof.

22 Claims, 16 Drawing Sheets

(56) References Cited

U.S. PATENT DOCUMENTS

| | | | |
|---|---|---|---|
| 2003/0102923 A1* | 6/2003 | Vickram | .................. H03F 1/523 |
| | | | 330/298 |
| 2009/0195946 A1* | 8/2009 | Kleveland | ............ H10D 89/601 |
| | | | 361/56 |
| 2012/0105167 A1 | 5/2012 | Min et al. | |
| 2013/0241666 A1 | 9/2013 | Granger-Jones et al. | |
| 2014/0285931 A1 | 9/2014 | Taft et al. | |
| 2016/0164471 A1 | 6/2016 | Shah et al. | |
| 2025/0007502 A1 | 1/2025 | Slaton et al. | |

OTHER PUBLICATIONS

International Search Report and Written Opinion issued for International PCT Application No. PCT/US2024/035311 filed on Jun. 24, 2024 on behalf of pSemi Corporation. Mail Date: Dec. 5, 2024. 20 pages.

Non-Final Office Action issued for U.S. Appl. No. 18/343,316, filed Jun. 28, 2023 on behalf of pSemi Corporation. Mail Date: Oct. 29, 2025. 6 Pages.

* cited by examiner

200A

201

OFF CHIP

ON CHIP

RESONANCE CANCELLATION DEVICES AND METHODS

CROSS-REFERENCE TO RELATED APPLICATIONS

The present application is a continuation-in-part of U.S. Ser. No. 18/343,316 filed on Jun. 28, 2023 and incorporated herein by reference in its entirety.

TECHNICAL FIELD

The present disclosure is related to resonance cancellation. More in particular, the disclosed methods and devices can be implemented in electronic circuits where storage and decoupling capacitors on input/output (I/O) pins resonate with the radio frequency (RF) ground.

BACKGROUND

RF switches have been used by RF engineers to implement a wide range of functions within RF circuits. For example, RF switches may be used in cellular phones to switch between different cellular bands. RF switches may also be used to selectively connection an antenna to a transmitter or a receiver. RF switches may be designed to provide isolation between signal paths, ensuring minimal interference and preserving signal quality. This capability is useful for minimizing cross-talk or spurious signals.

SUMMARY

The disclosed methods and devices address the above-mentioned performance degradation issues. According to the disclosed teachings, an inductor may be disposed on the IC or the PCB, the inductor being connected to the I/O pins in series with the decoupling capacitor. The inductance introduced by the added inductor will generate an inductive reactance that may fully or partially counteract the capacitive reactance of the decoupling capacitor. As a result, this approach can mitigate the performance degradation associated with resonance. In other words, by fully or partially cancelling the capacitive reactance of the decoupling capacitor, the resonant frequency of the parallel LC resonance is either substantially reduce or shifted out of the designed operational frequency band of the RF shunt switch and as a result, the negative impact of the resonance on the ON-resistance (Ron) of the RF shunt switch will be reduced or eliminated.

According to a first aspect of the present disclosure, circuital arrangement comprising an integrated circuit (IC) is provided, comprising: one or more shunt switches coupled to a first pin of the IC; a first electrostatic discharge protection device disposed inside the IC and coupled to the first pin of the IC; a first decoupling capacitor coupled across the first electrostatic discharge protection device; a storage capacitance disposed outside the IC and coupled to the first pin of the IC, wherein: the storage capacitance is configured as an alternating current (AC)-short circuit across an operational frequency band of the IC; a combination of the first electrostatic discharge protection element and the first decoupling capacitor is selectively switchable in and out; and when the combination of the first electrostatic discharge protection device and the first decoupling capacitor is switched out, the circuital arrangement is configured to attenuate a parasitic resonance formed when the combination of the first electrostatic discharge protection device and the first decoupling capacitor is switched in, by a combination of i) a series arrangement of a parasitic ground inductance inside the IC and a parasitic ground inductance outside the IC with ii) a parallel arrangement of the first decoupling capacitance and a parasitic capacitance, the parasitic resonance to be canceled or reduced occurring at a frequency within an operational frequency band of the circuital arrangement.

According to a second aspect of the present disclosure, circuital arrangement comprising an integrated circuit (IC) is provided, comprising: one or more shunt switches coupled a first pin of the IC; a first electrostatic discharge protection device, the first electrostatic discharge protection device being disposed inside the IC and coupled to a first pin of the IC; a first decoupling capacitance coupled across the first electrostatic discharge protection device; a storage capacitance disposed outside the IC and coupled to the first pin of the IC; wherein: the storage capacitance is configured as an alternating current (AC)-short circuit across an operational frequency band of the IC; the first electrostatic discharge protection device includes a first transistor and a second transistor connected to a second transistor, the first transistor being a field-effect transistor (FET) and the second transistor being a bipolar junction transistor (BJT), and a gate terminal of the FET and a base terminal of the BJT are configured to receive a negative bias voltage.

According to a third aspect of the present disclosure, circuital arrangement comprising an integrated circuit (IC) is provided, comprising: one or more shunt switches coupled to a first pin of the IC; a first electrostatic discharge protection device, the first electrostatic discharge protection device being disposed inside the IC and coupled to the first pin of the IC; a first decoupling capacitor coupled across the first electrostatic discharge protection device; a storage capacitance disposed outside the IC and coupled to the first pin of the IC; and a digital core inside the IC, coupled to the first pin through a series resistor; the series resistor being disposed inside the IC and being served to attenuate a parasitic resonance formed by a combination of i) a series arrangement of a parasitic ground inductance inside the IC and a parasitic ground inductance outside the IC with ii) a parallel arrangement of the first decoupling capacitance and a parasitic capacitance, the parasitic resonance to be canceled or reduced occurring at a frequency within an operational frequency band of the circuital arrangement.

According to a fourth aspect of the present disclosure, method of canceling or attenuating a resonance generated in a radio frequency (RF) integrated circuit (IC) circuit is disclosed, the IC including: a shunt switch connected to a pin of the IC an electrostatic discharge protection device connected to the pin; and a decoupling capacitor coupled across the electrostatic discharge protection device, the method comprising: connecting a storage capacitance outside the IC to the pin of the IC, the storage capacitance being an alternating current (AC)-short across an operational frequency band of the IC; applying an input RF voltage to a drain terminal of the shunt switch, thereby generating a parasitic resonance based on a combination of i) a series arrangement of a parasitic ground inductance inside the IC and a parasitic ground inductance outside the IC with ii) a parallel arrangement of a decoupling capacitance of the decoupling capacitor and a parasitic capacitance, and selectively switching out a combination of the decoupling capacitor and the electrostatic discharge protection device.

According to a fifth aspect of the present disclosure, a method of canceling or attenuating a resonance generated in a radio frequency (RF) integrated circuit (IC) circuit is disclosed, the IC including: a shunt switch connected to a pin of the IC; an electrostatic discharge protection device connected to the pin; and a decoupling capacitor coupled across the electrostatic discharge protection device, the method comprising: connecting a storage capacitance outside the IC to the pin of the IC, the storage capacitance being an alternating current (AC)-short across an operational frequency band of the IC; applying an input RF voltage to a drain terminal of the shunt switch, thereby generating a parasitic resonance based on a combination of i) a series arrangement of a parasitic ground inductance inside the IC and a parasitic ground inductance outside the IC with ii) a parallel arrangement of a decupling capacitance of the decoupling capacitor and a parasitic capacitance, and applying a negative bias voltage to the electrostatic discharge protection device.

According to a sixth aspect of the present disclosure, A method of canceling or attenuating a resonance generated in a radio frequency (RF) integrated circuit (IC) circuit, the IC including: a shunt switch connected to a pin of the IC; an electrostatic discharge protection device connected to the pin; a decoupling capacitor coupled across the electrostatic discharge protection device; and a digital core in the IC coupled to the pin, the method comprising: connecting, outside the IC, a storage capacitance to the pin of the IC, the storage capacitance being an alternating current (AC)-short across an operational frequency band of the IC; applying an input RF voltage to a drain terminal of the shunt switch, thereby generating a parasitic resonance based on a combination of i) a series arrangement of a parasitic ground inductance inside the IC and a parasitic ground inductance outside the IC with ii) a parallel arrangement of a decoupling capacitance of the decoupling capacitor and a parasitic capacitance, and coupling the digital core to the pin through a series resistor.

According to an eighth aspect of the present disclosure, circuital arrangement comprising an integrated circuit (IC) is provided, the IC comprising: a shunt switch; a decoupling capacitance connecting a source terminal of the switch to a first pin of the IC; a storage capacitance disposed outside the IC and coupled to the first pin of the IC; a resonance-canceling inductance disposed outside the IC and in series with the storage capacitance; a first electrostatic discharge (ESD) device, the first ESD device being disposed inside the IC and connected to the first pin of the IC, wherein: the storage capacitance acts as an alternating current (AC)-short circuit across an operational frequency band of the IC; the resonance-canceling inductance is configured to cancel or attenuate a parasitic resonance, by a combination of i) a series arrangement of a parasitic ground inductance inside the IC and a parasitic ground inductance outside the IC with ii) a parallel arrangement of the decoupling capacitance and a parasitic capacitance, the parasitic resonance to be canceled or reduced occurring at a frequency within an operational frequency band of the circuital arrangement.

According to a ninth aspect of the present disclosure, a circuital arrangement comprising an integrated circuit (IC) is provided, the IC comprising: a shunt switch; a decoupling capacitance connecting a source terminal of the switch to a first pin of the IC; a storage capacitance disposed outside the IC and coupled to the first pin; a resonance-canceling inductance disposed inside the IC and in series with the decoupling capacitance; a first electrostatic discharge (ESD) device, the first ESD device being disposed inside the IC and connected to the first pin of the IC, wherein: the storage capacitance acts as an alternating current (AC)-short circuit across an operational frequency band of the IC; the resonance-canceling inductance is configured to cancel or attenuate a parasitic resonance, by a combination of i) a series arrangement of a parasitic ground inductance inside the IC and a parasitic ground inductance outside the IC with ii) a parallel arrangement of the decoupling capacitance and a parasitic capacitance, the parasitic resonance to be canceled or reduced occurring at a frequency within an operational frequency band of the circuital arrangement.

Further aspects of the disclosure are provided in the description, drawings and claims of the present application.

DESCRIPTION OF THE DRAWINGS

Like reference numbers and designations in the various drawings indicate like elements.

DETAILED DESCRIPTION

Throughout this document, the phrase "in the absence of an inductor" refers to the condition when the inductor is replaced by either a short circuit or a wire with no resistance. For instance, the term "the resonance generated in the absence of the resonance-canceling inductor" shall denote the resonance produced when the resonance-canceling inductor is not implemented or, stated differently, is replaced with either a short circuit or a wire with no resistance.

In RF systems that use shunt switches, the ground impedance can have a detrimental effect on the system performance by de-Qing, i.e., degrading the quality factor (Q-factor), of the short or the component(s) that the RF shunt switch is designed to actuate. In general, the ground impedance manifests as a relatively low resistance and inductance, which has negligible impact on the overall system performance. However, in some applications where radio frequency (RF) integrated circuits (ICs) are implemented, the ground inductance may resonate with the decoupling capacitor placed on an analog input/output (I/O) pin of the IC, the I/O pin being also connected to a large storage cap that acts as a short at RF frequencies. Such parallel LC resonance essentially occurs between the on-chip (inside the IC) capacitances and the combination of the on-chip (inside the IC) and off-chip (outside the IC) parasitic inductances. As a result, an undesired real impedance at the system operational frequencies may be generated, and this may cause an overall degradation of the system performance.

Figure 1:
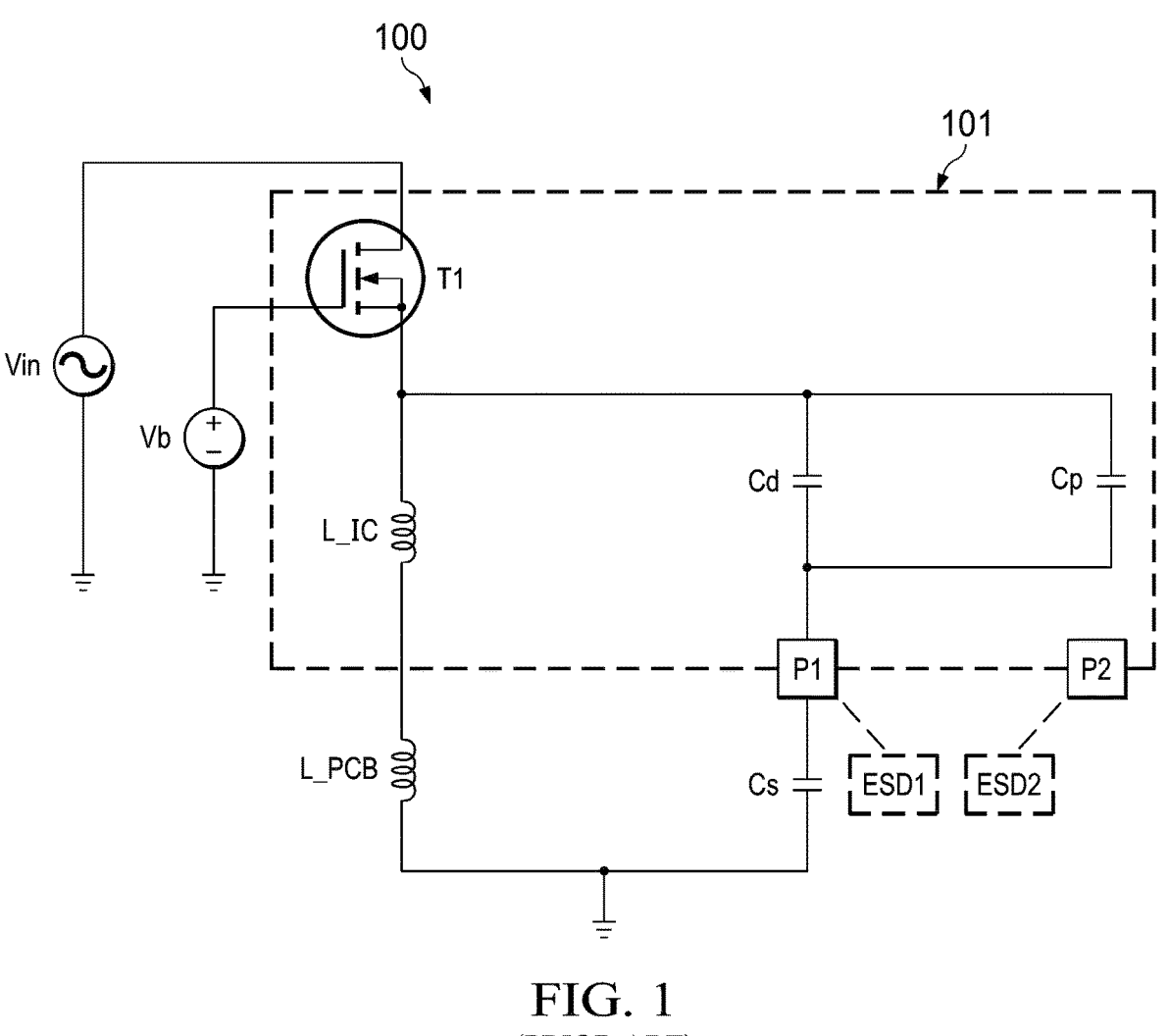
FIG. 1 shows a prior art circuital arrangement representing a portion of an RF system.

In order to further clarify the above-mentioned performance degradation issue, reference is made to FIG. 1 showing a prior art circuital arrangement (100), representing a portion of an RF system, the circuital arrangement including IC (101) disposed on a printed circuit board (not shown). IC (101) includes transistor (T1), essentially a shunt switch, and decoupling capacitor (Cd). Transistor (T1) is biased through off-chip bias voltage (Vb) and is configured to receive RF input voltage (Vin). Two pins (P1, P2) of the IC (101) are also shown. Optional on-chip electrostatic discharge protection (ESD) devices (ESD1, ESD2) are connected to terminals or pins (P1, P2), respectively. Circuital arrangement (100) further includes an off-chip storage capacitor (Cs) connected to pin (P1). Such a storage capacitor is large enough to act as an AC short at operational frequencies of the arrangement. Pin (P2) may be optionally connected to output buffers, I/O elements or other elements of the RF system, none of such elements being shown, for better clarity of the drawing. Parasitic capacitances generated by various elements such as ESD devices, pin drivers, and I/O elements are all lumped together and represented by parasitic capacitor (Cp). It is understood that capacitor (Cp) is not a physical element, but rather a representation of parasitic capacitances generated by various elements of the system. Similarly, on-chip parasitic inductances are represented by a series arrangement of the on-chip parasitic inductor (L_IC) and the off-chip parasitic inductor (L_PCB). Again, here the off-chip and on-chip inductors as shown, are not physical elements, but rather a representation of parasitic inductances affecting the IC's performance. In operative conditions, when RF voltage (Vin) is applied, storage capacitor (Cs) acts as an AC short.

With continued reference to FIG. 1, depending on the operational frequency and the inductance and capacitance values of various elements, a combination of the on-chip and off-chip inductors (L_IC, L_PCB) in parallel with a combination of capacitors (Cd, Cp) may generate a parallel LC resonance. The generated resonance will cause an increase of the ON resistance (Ron) of transistor (T1), thus degrading the overall performance of the RF system as described previously.

Figure 2A:
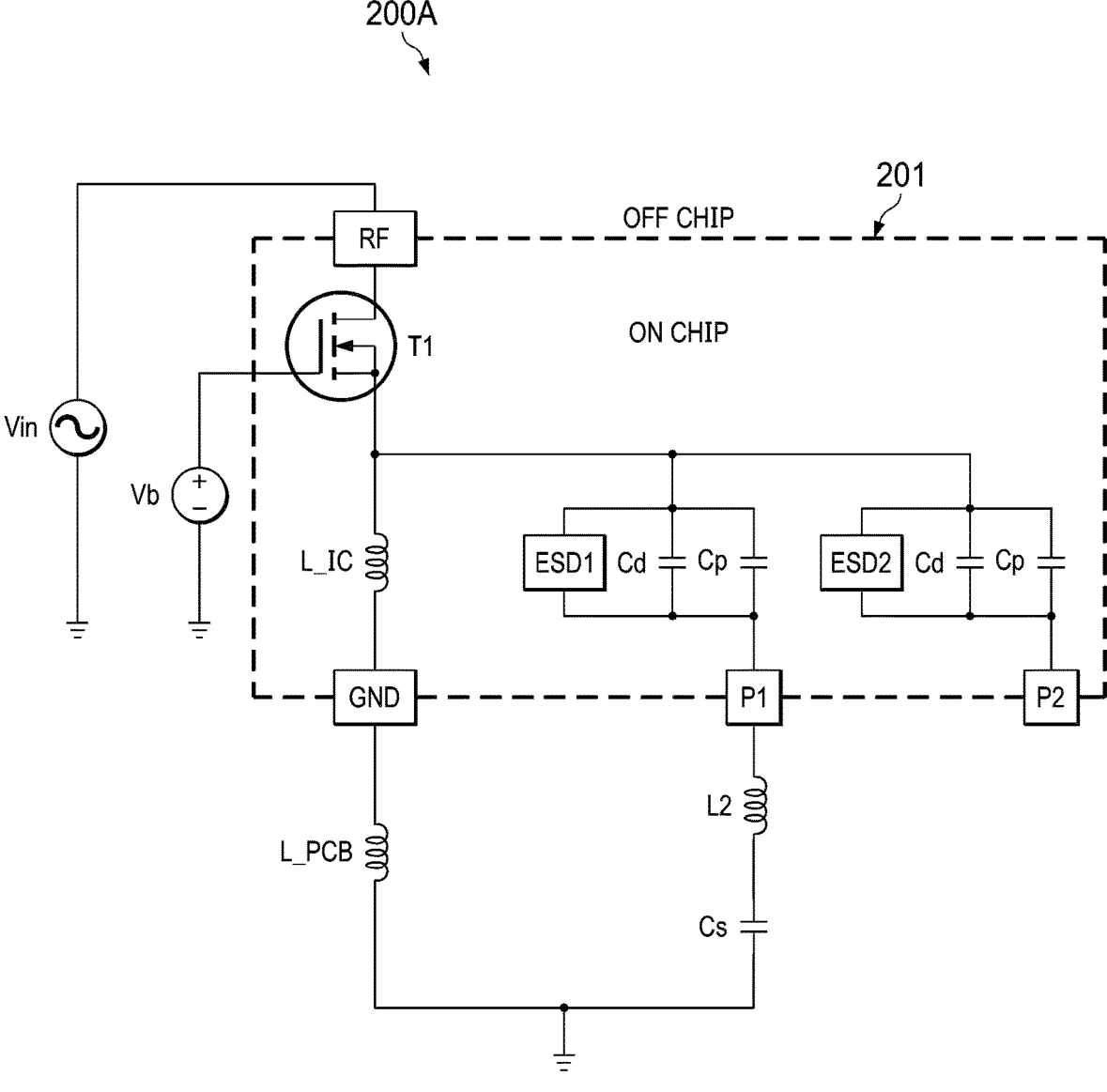
FIGS. 2A-2I shows example circuital arrangements in accordance with embodiments of the present disclosure.

FIG. 2A shows an example circuital arrangement (200A) in accordance with an embodiment of the present disclosure. Circuital arrangement (200A) represents a portion of an RF system and is similar to the circuital arrangement (100) of FIG. 1 except for the addition of inductor (L2) and positioning of ESD devices (ESD1, ESD2), which devices are now disposed on-chip. Such inductor is disposed off-chip (i.e., outside the integrated circuit or chip (201)), connected to pin (P1), and in series with the decoupling capacitor (Cd) and storage capacitor (Cs). The inductance of inductor (L2) may be selected such that the resulting inductive reactance would cancel, partially or fully, the capacitive reactance of the combination of decoupling and parasitic capacitors (Cd, Cp). In other words, the parallel LC resonance as previously described is mostly eliminated and its negative impact on the ON resistance (Ron) of transistor (T1) is substantially reduced. As inductor (L2) is placed downstream of pin (P1), the parasitic capacitance due to ESD device (ESD1) can also be addressed and compensated for, when implementing inductor (L2) as such.

Figure 2B:
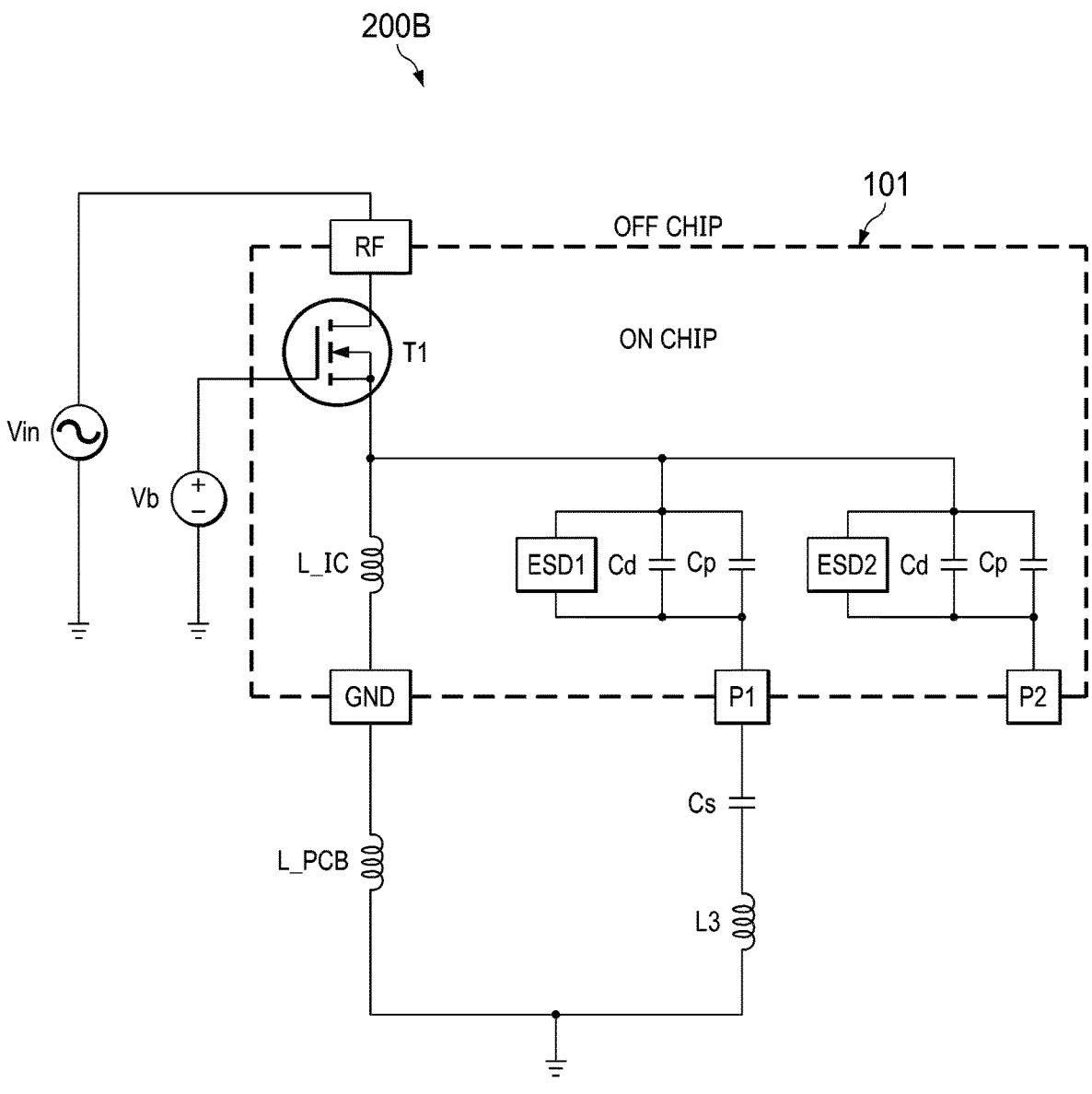

FIG. 2B shows an example circuital arrangement (200B) in accordance with an embodiment of the present disclosure. Circuital arrangement (200B) represents a portion of an RF system and is similar to the circuital arrangement (200A) of FIG. 2A except that this time the inductor (referred here as L3) is placed not only off-chip, but also downstream of storage capacitor (Cs). Inductor (L3) has the same functionality as inductor (L2) of FIG. 2A, i.e., canceling the capacitive reactance due to capacitors (Cd, Cp) to avoid the previously described parallel LC resonance and its undesired impact on the overall performance of the RF system.

Figure 2C:
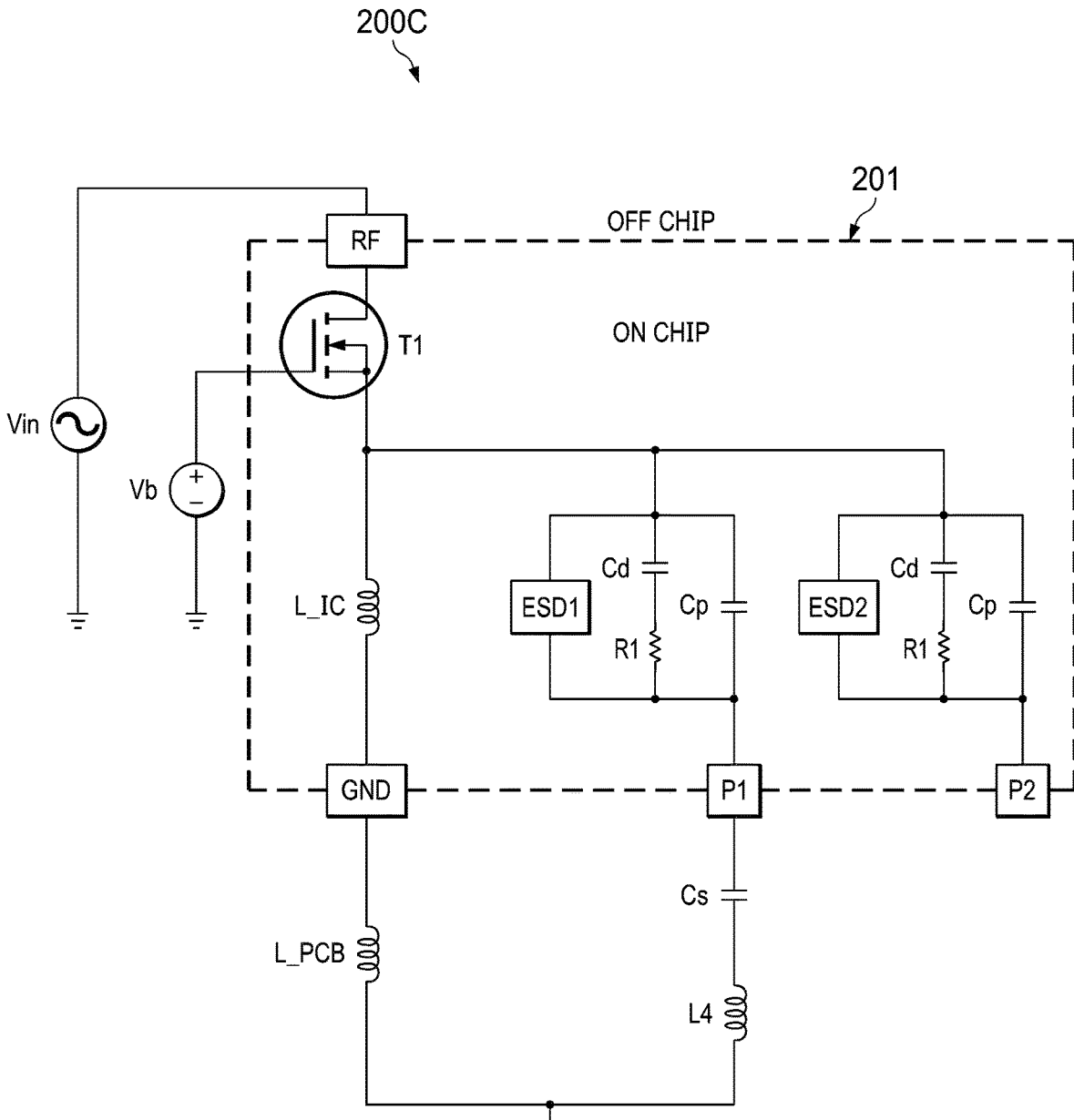

FIG. 2C shows an example circuital arrangement (200C) in accordance with an embodiment of the present disclosure. Circuital arrangement (200C) represents a portion of an RF system and is similar to the circuital arrangement (200B) of FIG. 2B, except for the addition of resistor (R1). Such resistor is disposed on-chip, connected to pin (P1), and in series with the decoupling capacitor (Cd). Resistor (R1) is essentially a de-Qing resistor, serving to spread the resonance over frequencies, thus mitigating the adverse impact of the resonance on the system performance.

Figure 2D:
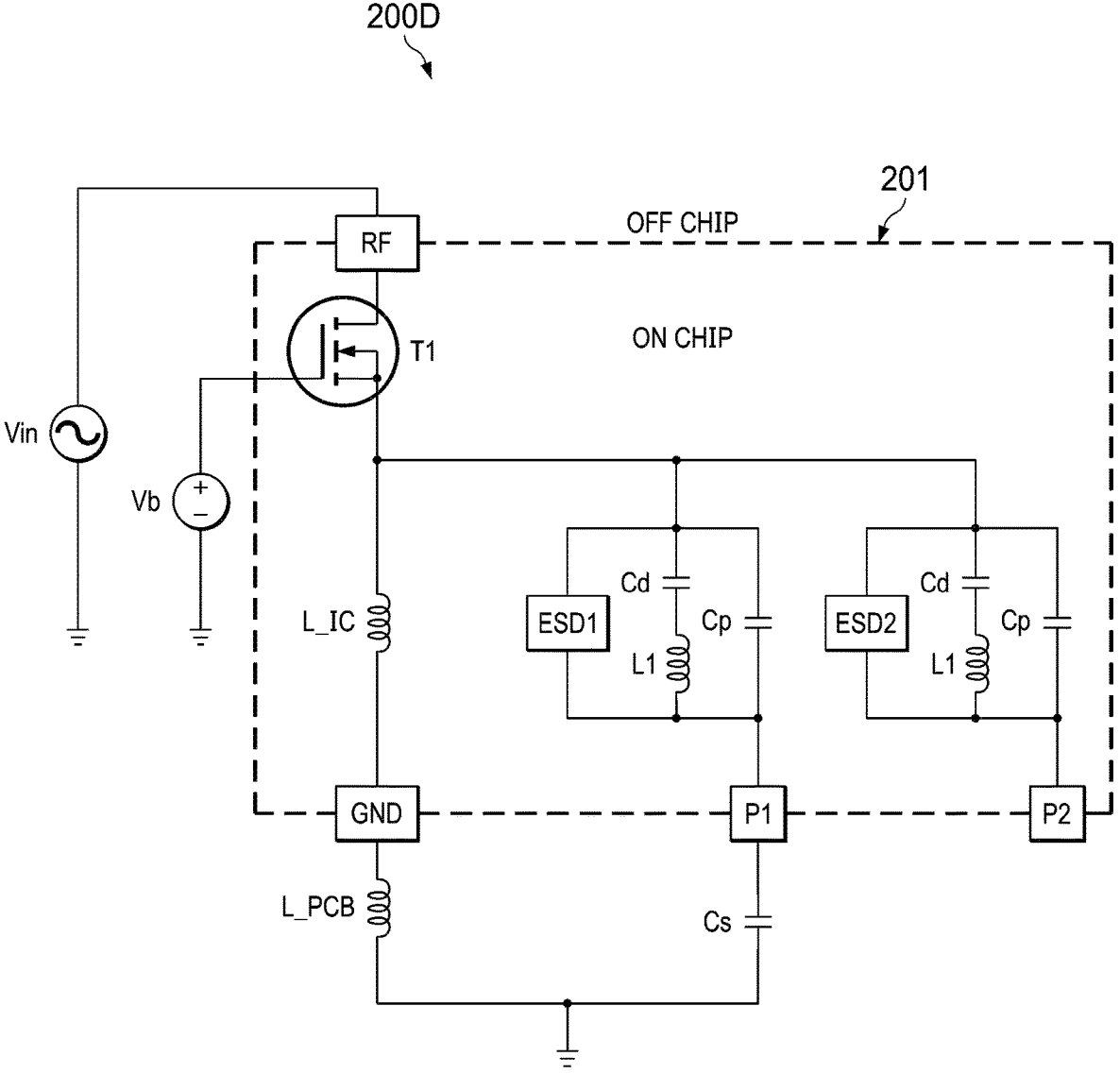

FIG. 2D shows an example circuital arrangement (200D) in accordance with an embodiment of the present disclosure. Circuital arrangement (200D) represents a portion of an RF system and is similar to the circuital arrangement (100) of FIG. 1 except for the addition of inductor (L1). Such inductor is disposed on-chip, connected to pin (P1), and in series with the decoupling capacitor (Cd). In contrast with the embodiment of FIG. 2A, as inductor (L1) is disposed upstream of pin (P1), the parasitic capacitance due to ESD device (ESD1) is not factored in when selecting the inductance of inductor (L1).

Figure 2E:
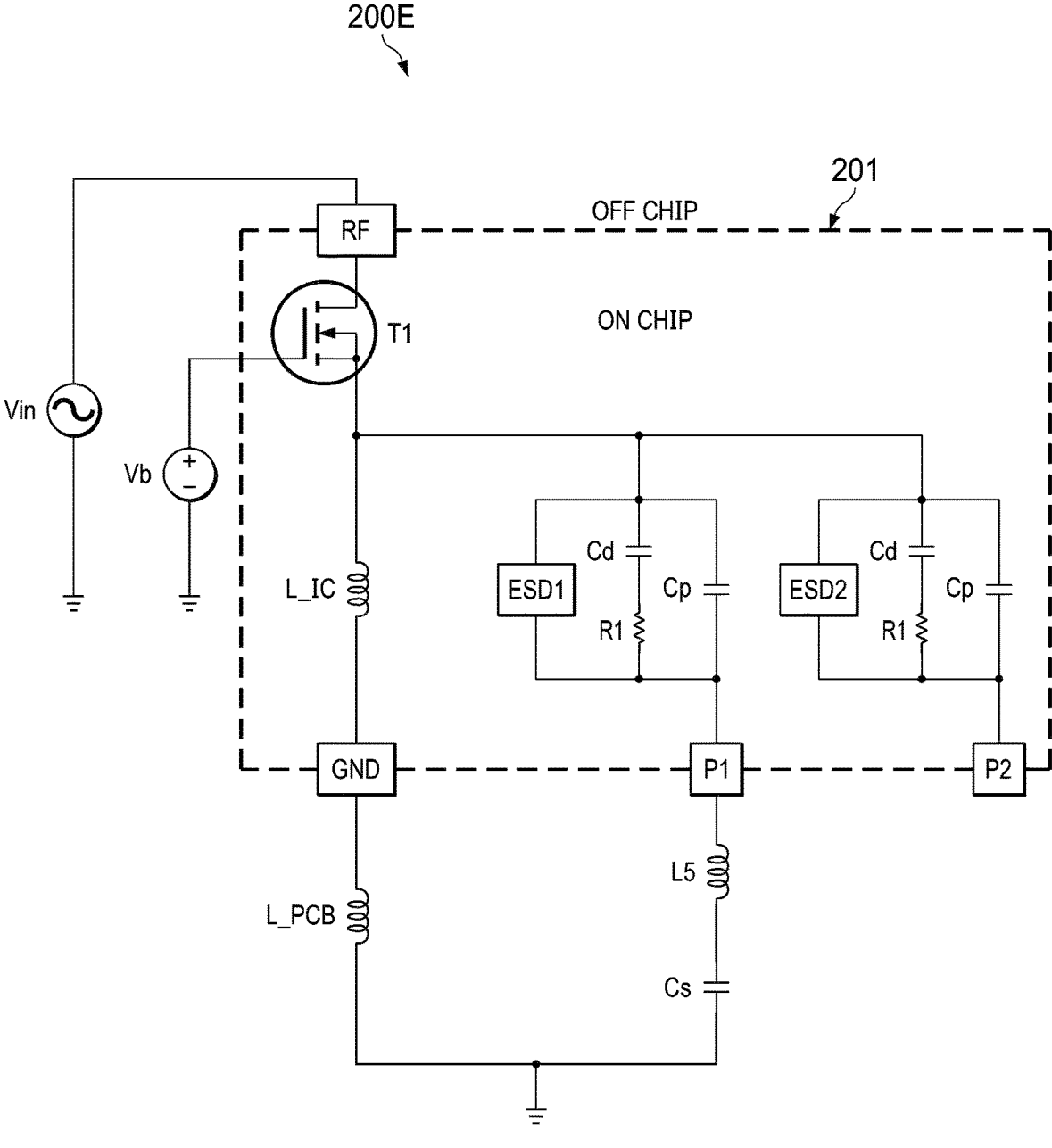

FIG. 2E shows an example circuital arrangement (200E) in accordance with an embodiment of the present disclosure. Circuital arrangement (200E) represents a portion of an RF system and is similar to the circuital arrangement (200A) of FIG. 2A, except for the addition of resistor (R1). Such resistor is disposed on-chip, connected to pin (P1), and in series with the decoupling capacitor (Cd). Resistor (R1) is essentially a de-Qing resistor, serving to spread the resonance over frequencies, thus reducing the system performance degradation due to such resonance. The off-chip inductor of FIG. 2E is indicated as (L5) in the figure.

Figure 2F:
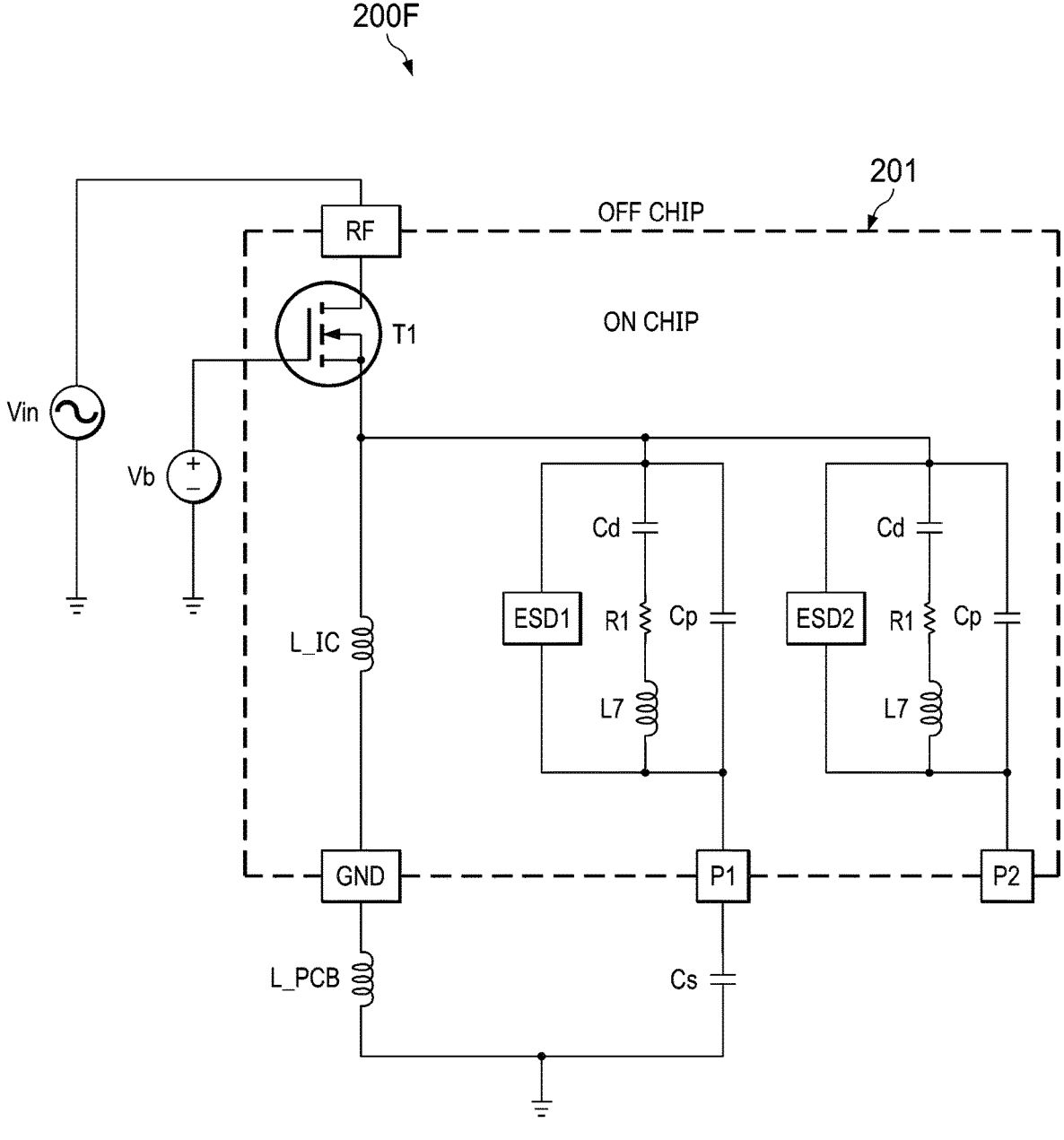

FIG. 2F shows an example circuital arrangement (200F) in accordance with an embodiment of the present disclosure. Circuital arrangement (200F) represents a portion of an RF system and is similar to the circuital arrangement (200D) of FIG. 2D, except for the addition of resistor (R1). The placement and functionality of such resistor is similar to what was described with regards to the embodiments of FIGS. 2C, and 2E. The on-chip inductor of FIG. 2F is indicated as (L7) in the figure.

Figure 2G:
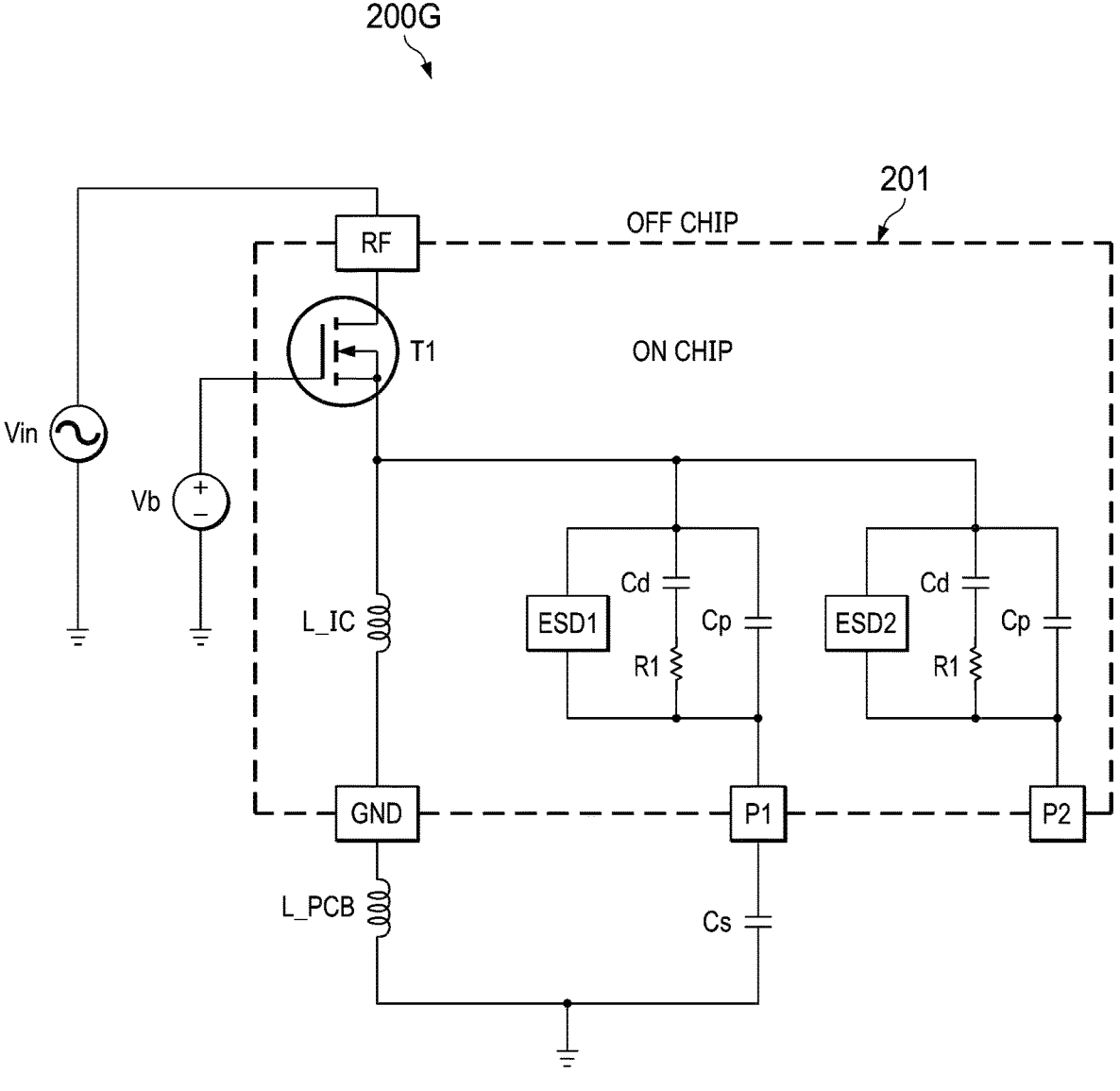

FIG. 2G shows an example circuital arrangement (200G) in accordance with an embodiment of the present disclosure. Circuital arrangement (200G) represents a portion of an RF system and is similar to the circuital arrangement (100) of FIG. 1, except for the addition of resistor (R1). In contrast with the embodiments described so far, this embodiment does not implement any additional inductor. This is a tradeoff between the resulting performance and occupied space. Inductors need large space to be implemented and this would be prohibitive in some applications. By only adding an on-chip resistor, the resonance is spread out along frequencies and the performance issues related to resonance are mitigated to some extent, while less die space is required for the design.

In reference to the disclosed embodiments, it should be noted that the parasitic capacitances could vary across different systems. Referring to, for example, FIG. 2A, in some applications, pins (P1, P2) may be swappable. While in the embodiment of FIG. 2A storage capacitor (Cs) is connected to pin (P1) and some I/O elements are connected to pin (P2), in a different embodiment a distinct arrangement can be envisioned, i.e. storage capacitor (Cs) may be connected to pin (P2) and I/O elements to pin (P1). Moreover, the printed circuit boards (PCBs) used to host the IC may be different across various systems. In view of all this, the parasitic capacitances may differ from one system to another, and it is desirable to have a solution addressing such variations. According to the teachings of the present disclosure, a solution to this issue is to implement tunable decoupling capacitors.

Figure 2H:
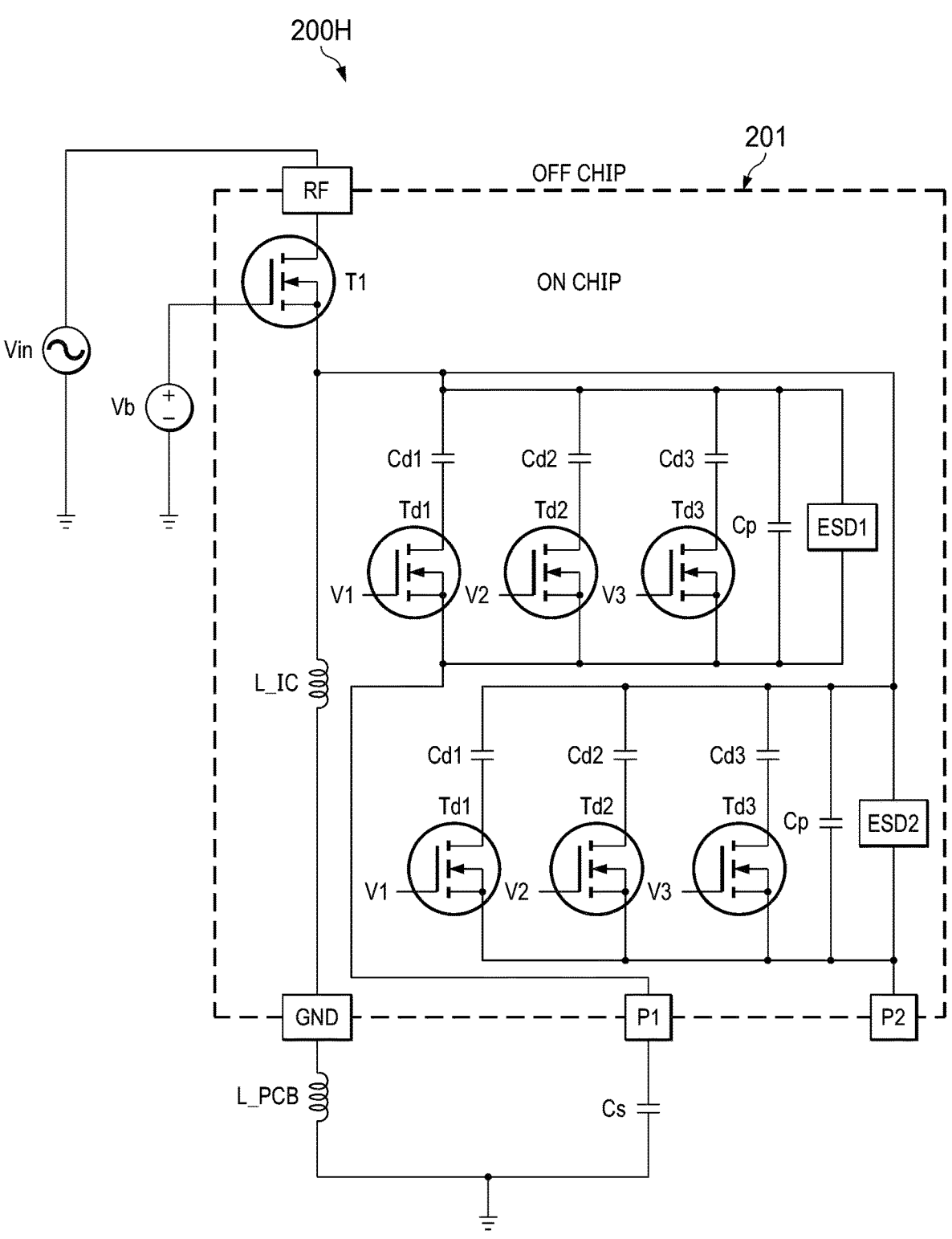

FIG. 2H shows an example circuital arrangement (200H) in accordance with an embodiment of the present disclosure. This arrangement implements a digital tunable capacitor, DTC (202) which includes multiple transistors (e.g., Td1, Td2, Td3) receiving their respective bias voltages (V1, V2, V3). Such bias voltages are used to control the transistors by independently turning them on or off. As a result, capacitors (Cd1, Cd2, Cd3) will be switched in or out to adjust the overall decoupling capacitance. Based on this approach, the resonance frequency can be shifted around to address the previously mentioned variability across systems. DTC (202) may include two or more transistors and two or more corresponding capacitors. According to the teachings of the present disclosure, all of the embodiments of FIGS. 2A-2G can also implement a DTC instead of a fixed decoupling capacitor to improve design flexibility. In any of the embodiments of FIGS. 2A-2G, the added inductor and/or resistor may be adjustable, meaning that such elements may be variable or switchable to make the design even more flexible.

Figure 2I:
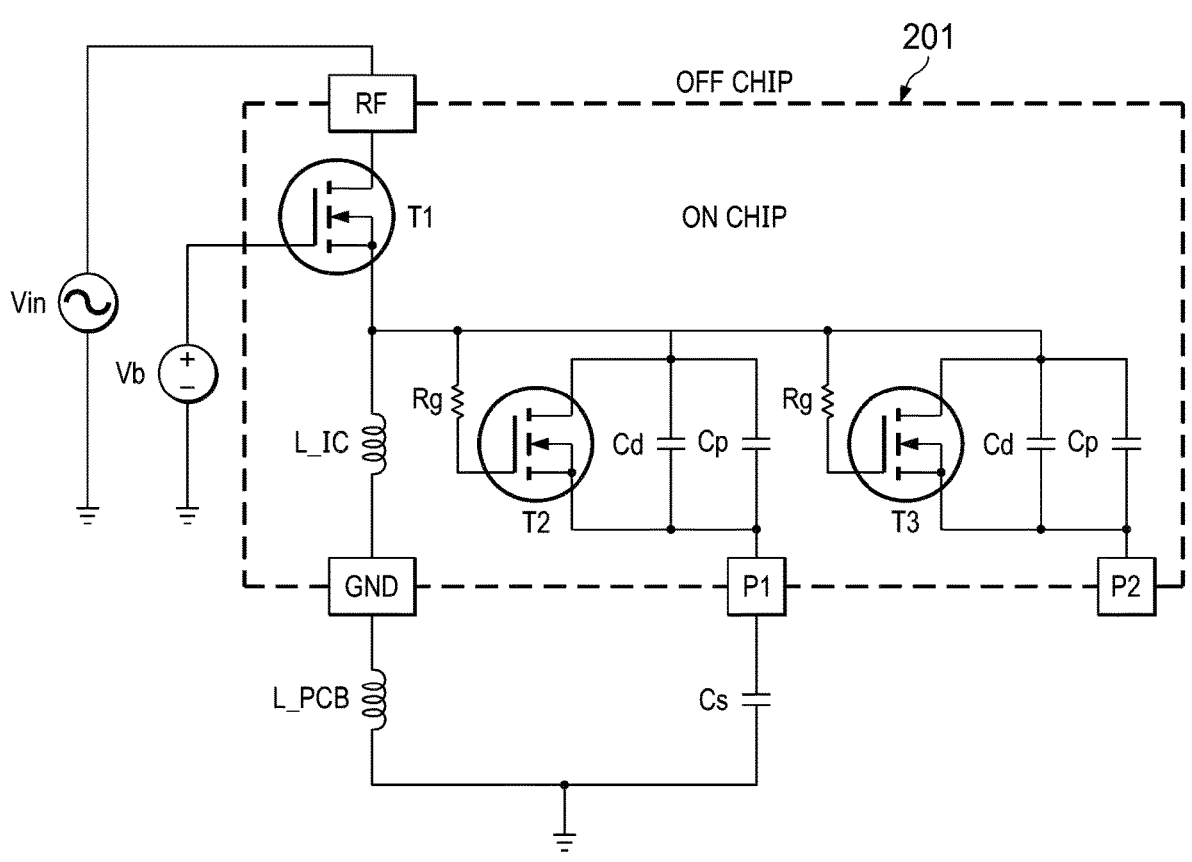

FIG. 2I shows an example circuital arrangement (200I) in accordance with an embodiment of the present disclosure. Circuital arrangement (200I) represents a portion of an RF system. A transistor (T2) with a series gate resistor (Rg) is shown. In this the combination of transistor (T2) and resistor (Rg) on the left side is an exemplary implementation of ESD device (ESD1) of FIGS. 2B-2H. Similarly, the combination of transistor (T3) and resistor (Rg) on the right side provides an exemplary implementation of ESD device (ESD2).

Figure 3:
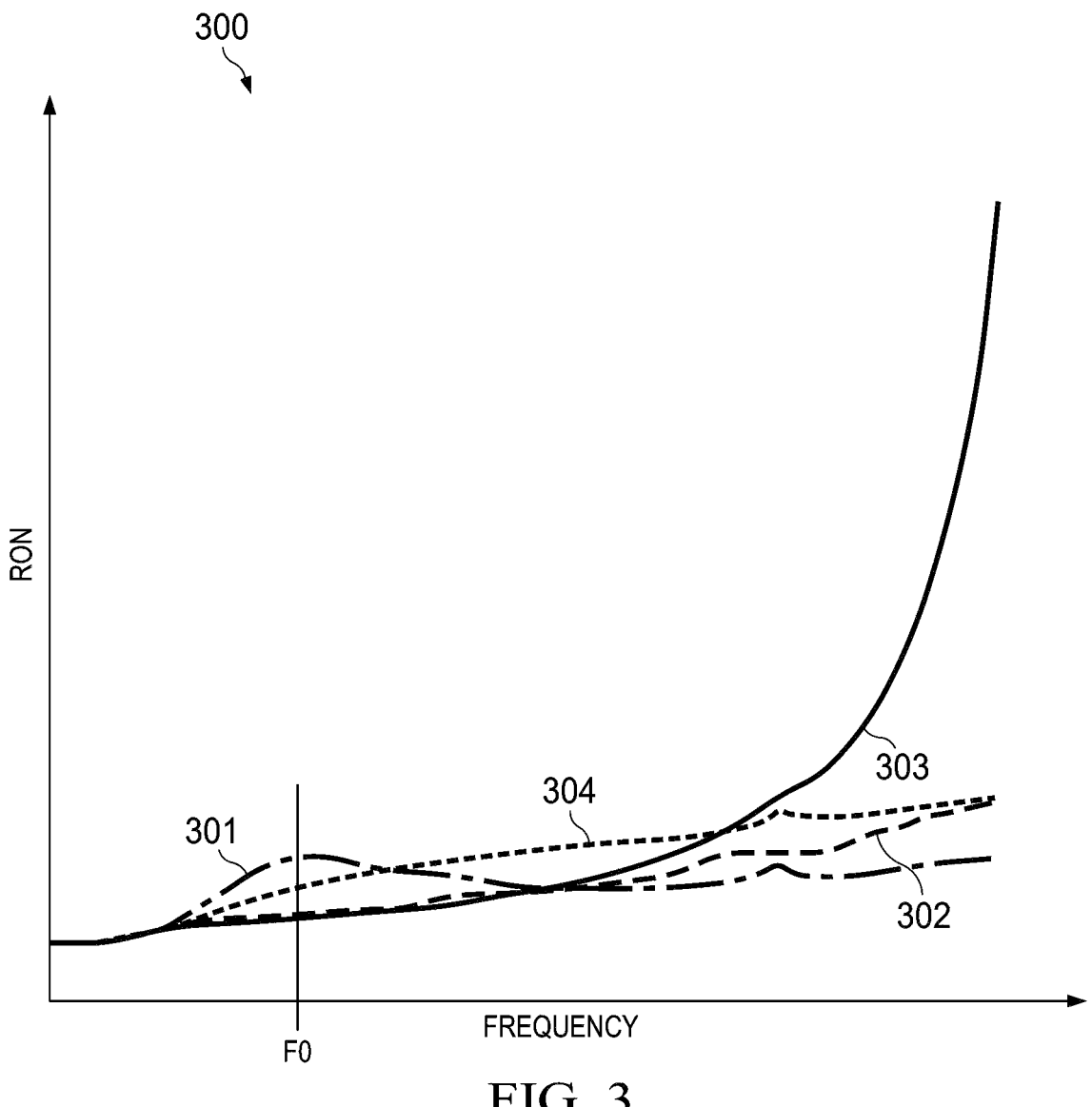
FIG. 3 shows an example graph in accordance with the teachings of the present disclosure, the graph illustrating the variations of the ON resistance of a shunt switch vs. frequency for various disclosed embodiments.

FIG. 3 shows an example graph (300) in accordance with an embodiment of the present disclosure. With reference to the disclosed embodiments, the shown curves represent the variations of the Ron of transistor (T1) vs. frequency for different embodiments. Curve (301) illustrates the case where no resonance-cancellation is applied, i.e. the prior art case of FIG. 1. As can be noticed, the undesired resonance as previously described is occurring at frequency (FO). Curve (302) corresponds to the embodiment of FIG. 2A where resonance-canceling inductor (L2) is implemented downstream of pin (P1), thus mitigating the on-chip parasitic capacitances including the parasitic capacitance due to ESD device (ESD1). Curve (303) corresponds to the embodiment of FIG. 2D where the resonance-canceling inductor (L1) is implemented on-chip and upstream of pin (P1). As such, this scheme does not compensate for the parasitic capacitance caused by the ESD device (ESD1), and as a result, an increase in Ron can be noticed at higher frequencies. Curve (304) corresponds to the case where no resonance-canceling is implemented but instead a resistor is used to spread the resonance across the frequencies, i.e. embodiment of FIG. 2H. This scheme is suitable for the applications where implementing an inductor or the integration of an inductor may be prohibitive due to stringent cost and/or space constraints.

In accordance with the teachings of the present disclosure and without departing from the fundamental scope and spirit of the invention, in all of the described embodiments, the storage capacitor may also be implemented on-chip.

As has been generally described above, RF shunt switches implemented in RF systems work by forming a short circuit path to ground to route radio frequency (RF) signals. Their optimal performance relies on having a low impedance path to ground. This ground impedance usually comes from small resistances and inductances that have a negligible impact. However, in some applications, the ground inductance can resonate with the decoupling capacitor placed on the IC analog input/output (I/O) pins, when those pins also connect to a large off-chip storage capacitor.

This off-chip storage capacitor acts as an AC-short circuit at RF frequencies. The resulting parallel LC resonance between the on-chip capacitance and PCB/IC ground inductance causes a peak real impedance at certain frequencies that may overlap with the RF switch's operating band. This degrades its performance through a de-Qing effect that lowers its quality factor and increases insertion loss.

One possible mitigation is the addition of a series inductor on the pin connecting the storage capacitor. This shifts the resonant frequency out of band. However, even relatively small RF voltage swings compared to the switch can turn on ESD protection devices. This causes increased supply current and harmonic generation that further degrades RF system performance.

Building upon the previously described devices and methods, and in order to illustrate the wide applicability of the presented solutions, further exemplary embodiments are described below. While differing in some respects, these additional embodiments still share core structural similarities with the embodiments previously outlined. The following examples demonstrate how the underlying teachings can be adapted to enable a diverse range of implementations.

Figure 4A:
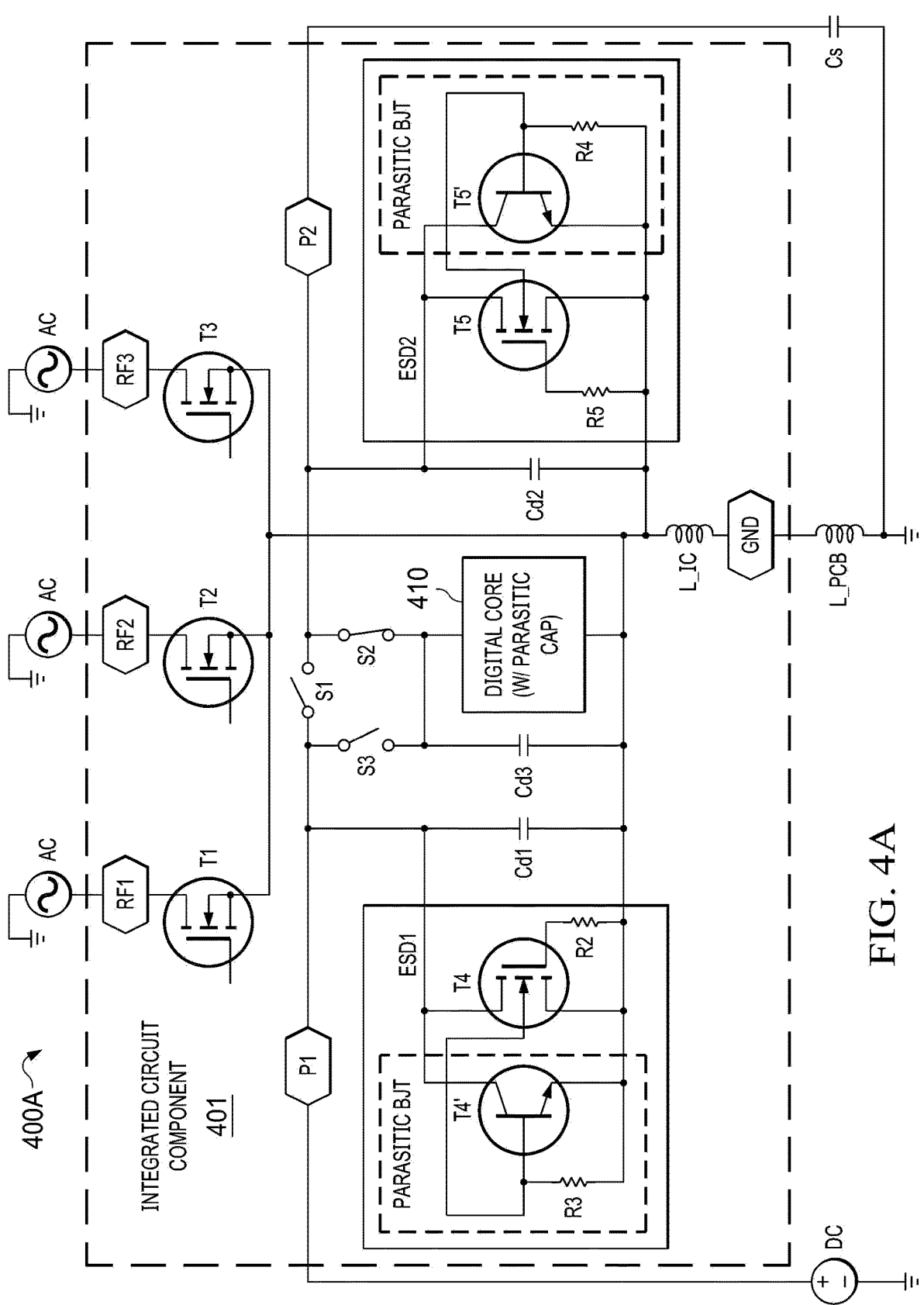
FIG. 4A shows a circuital arrangement representing a portion of an RF system.

FIG. 4A shows a circuital arrangement (400A), representing a portion of an RF system, the circuital arrangement including IC (401) disposed on a printed circuit board (not shown). IC (401) includes transistors (T1, T2, T3) that are essentially shunt switches arranged in parallel. IC (401) further includes decoupling capacitors (Cd1, Cd2. Cd3). Transistors (T1, T2, T3) may be biased through off-chip bias voltages that are now shown for the reason of brevity. Elements shown in hexagons represent IC bumps or pins. Transistors (T1, T2, T3) are configured to receive RF input voltages (AC) through respective IC pins (RF1, RF2, RF3). Two pins (P1, P2) of the IC (401) are also shown. Optional on-chip electrostatic discharge protection (ESD) devices (ESD1, ESD2) are connected to terminals or pins (P1, P2), respectively. Circuital arrangement (400A) further includes an off-chip storage capacitor (Cs) connected to pin (P2). Such a storage capacitor is large enough to act as an AC short at operational frequencies of the arrangement. In general, storage capacitor (Cs) may be connected to either of pins (P1, P2). When connected to one of such pins, the other pin will act as the analog/digital supply interface pin. In the configuration shown, as storage capacitor (Cs) is connected to pin (P2), pin (P1) is the analog/digital supply interface receiving bias voltage from the bias source (DC). Pin (P2) may be optionally connected to output buffers, I/O elements or other elements of the RF system, none of such elements being shown, for better clarity of the drawing.

IC (401) of FIG. 4A further comprises a digital core (410) which may include parasitic capacitances affecting the overall performance of system. There are various sources of parasitic capacitances in such system. Various elements such as ESD devices, pin drivers, the digital core and I/O elements may generate parasitic capacitances that have negative impact on the performance of the device, as described previously. Such parasitic capacitances are not shown in the figure, and it is understood that they do not represent a physical element. On-chip parasitic inductances are represented by a series arrangement of the on-chip parasitic inductor (L_IC) and the off-chip parasitic inductor (L_PCB). The off-chip and on-chip inductors as shown, are not physical elements, but rather a representation of parasitic inductances affecting the IC's performance.

With continued reference to FIG. 4A, decoupling capacitors (Cd1, Cd2, Cd3) are coupled across ESD elements (ESD1, ESD2) and digital core (410), respectively. ESD element (ESD1) includes interconnected transistors (T4, T4'). By way of example, transistor (T4) may be a field-effect transistor (FET) while transistor (T4') may be a bipolar junction transistor (BJT). The base terminal of transistor (T4') and the gate terminal of transistor (T4) are coupled to ground via resistors (R3, R2), respectively. Similarly, ESD element (ESD2) includes interconnected transistors (T5, T5'). By way of example, transistor (T5) may be a FET while transistor (T5') may be a BJT. The base terminal of transistor (T5') and the gate terminal of transistor (T5) are coupled to ground via resistors (R5, R4), respectively.

Also shown in FIG. 4A are switches (S1, S2, S3). Switch (S1) is used to connect pin (P1) to pin (P2) and therefore provides a path to charge storage capacitor (Cs). Switches (S2, S3) are used to connect pins (P1, P2) to an internal supply (not shown for the sake of brevity).

With further reference to FIG. 4A, RF voltage swings across analog/digital I/O ESD devices (ESD1, ESD2) at or near the resonance frequency formed by the shared RF/analog/digital ground inductance and the capacitances to ground in the analog/digital circuits, both intentional and parasitic, cause the ESD devices to be triggered. Additionally, higher ground impedances at this resonance frequency cause a frequency-dependent increase in measured ON resistance (R_on) for shunt RF switches that share the analog/digital ground with RF. Capacitors intentionally placed on the device analog/digital I/O pins to decouple RF signals, i.e. decoupling capacitors (Cd1, Cd2, Cd3), may be unintentionally coupled to these pins by the limited isolation. This may form a part of the capacitance that is resonating with the ground inductance, so reducing this capacitance may help to shift the frequency of this resonance and improve device performance.

According to the teachings of the present disclosure, in order to reduce the capacitance involved in the above-mentioned resonance, an RF switch may be placed in series with the intentional capacitance and the I/O and ground pins such that this capacitance may be switched in or out as desired based on application, since the frequency of resonance is greatly affected by the amount and Q of ground inductances, both on die and on measurement fixtures or application circuit.

Figure 4B:
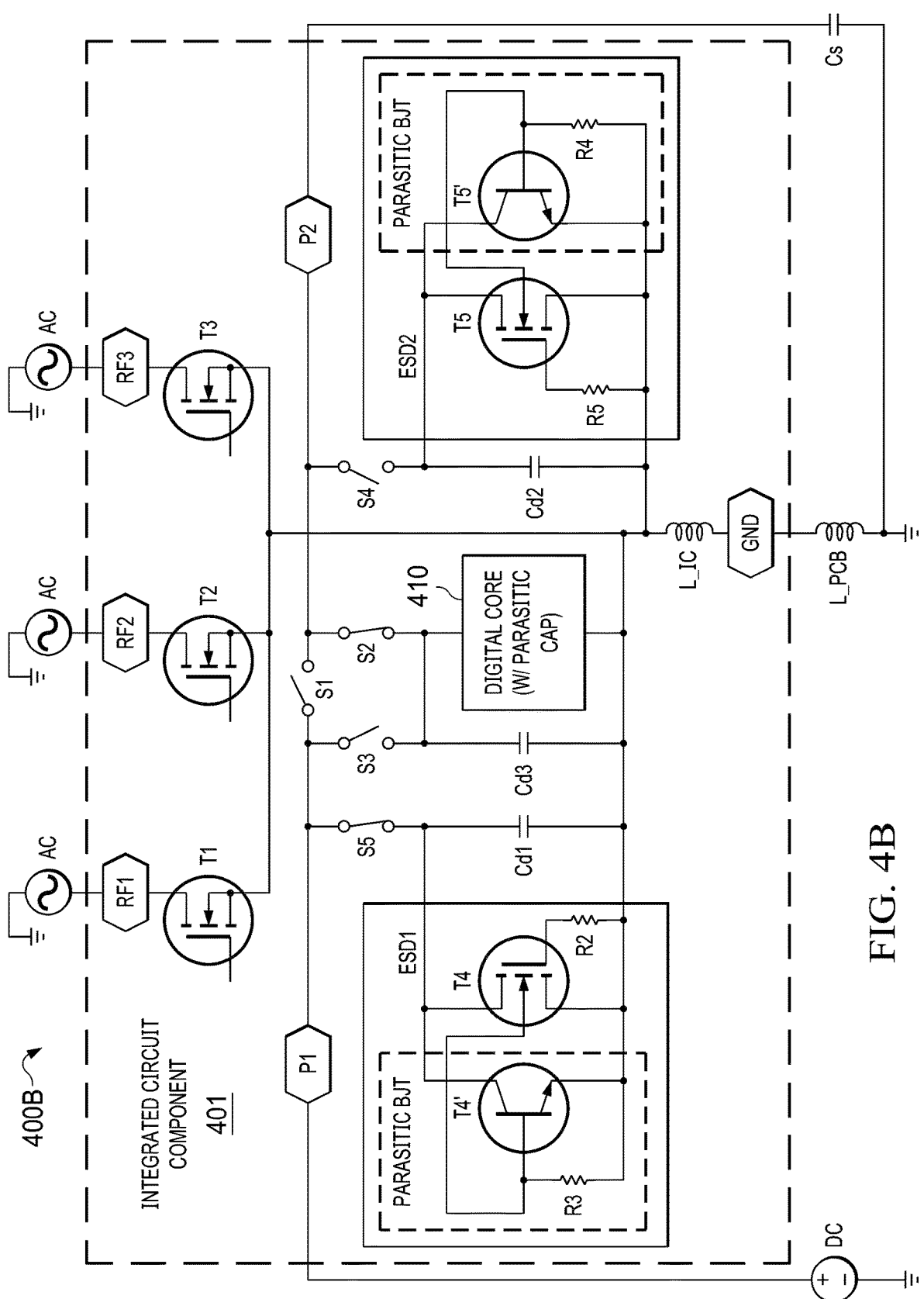
FIGS. 4B-4E shows example circuital arrangements in accordance with embodiments of the present disclosure.

In order to show embodiments related to this improvement, reference is made to FIG. 4B showing an example circuital arrangement (400B) in accordance with an embodiment of the present disclosure. Circuital arrangement (400B) represents a portion of an RF system and is similar to the circuital arrangement (400A) of FIG. 4A except for the addition of switches (S4, S5), disposed in the IC (410) coupling pin (P2) to ESD device (ESD2) and pin (P1) to ESD device (ESD1) respectively. Depending on the application, decoupling capacitor (Cd2) may selectively be switched out by opening switch (S4), thereby shifting the frequency of the undesired above-mentioned resonance away from the operational frequency band of the device. This will improve the overall performance of the system. Switch (S5) may still be closed to keep decoupling capacitor (Cd1) switched in to allow such capacitor performing its decoupling functionality. According to further embodiments of the present disclosure, in the devices where storage capacitor (Cs) is connected to pin (P1), switch (S5) may be open to switch out decoupling capacitor (Cd1) while switch (S4) may be closed during this time to keep decoupling capacitor (Cd2) switched in to allow such capacitor performing its decoupling functionality.

Figure 4C:
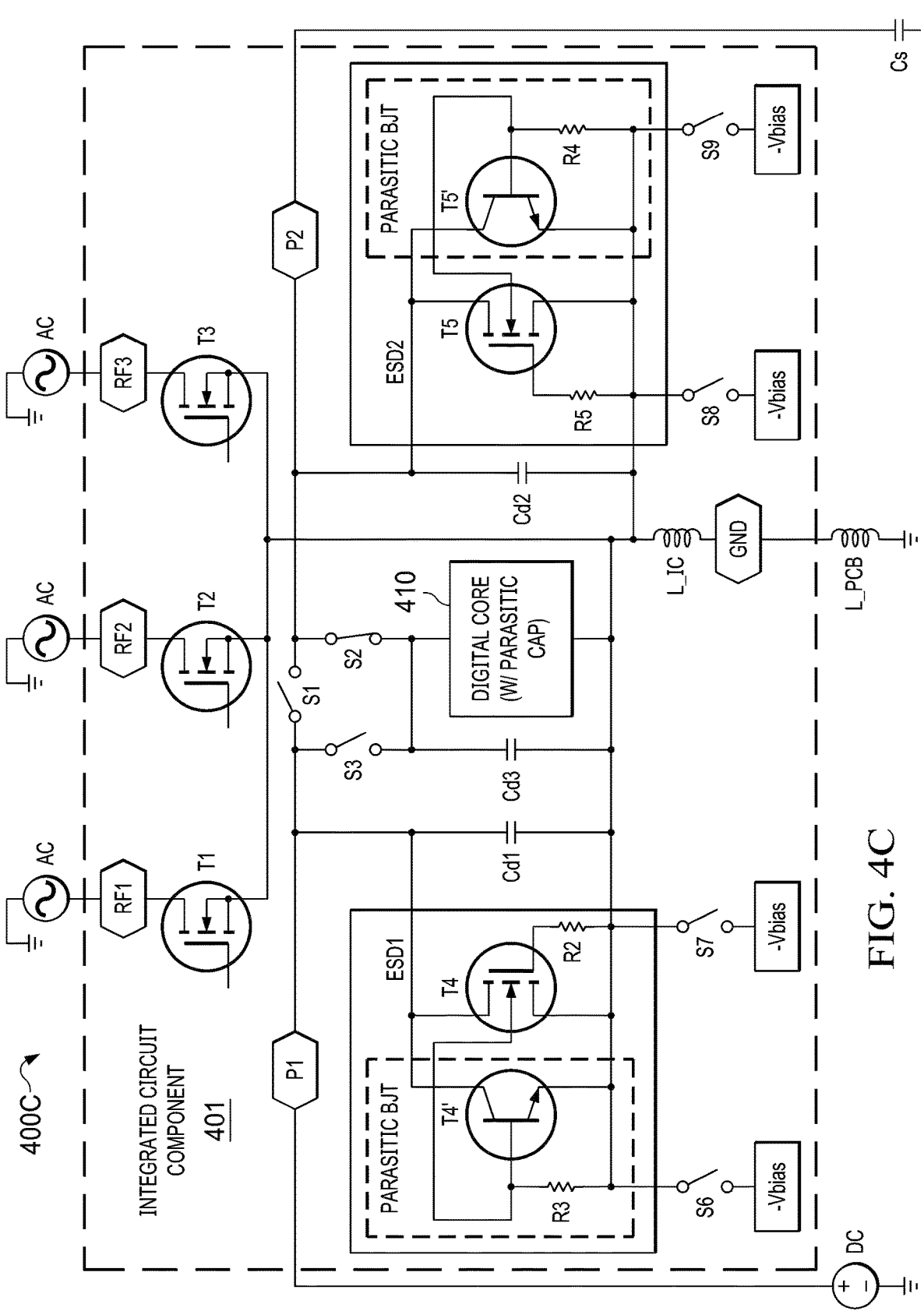

FIG. 4C shows an example circuital arrangement (400C) in accordance with an embodiment of the present disclosure. Circuital arrangement (400C) represents a portion of an RF system and is similar to the circuital arrangement (400A) of FIG. 4A except for the addition of bias voltages (Vbias) applied to transistors (T5, T5'). Such bias voltages are applied to the source terminal and the base terminal of transistors (T5, T5'), vias bias resistors (R5, R4), respectively. The function of bias voltages (Vbias) is to feed transistors (T5, T5') with a voltage less than the device ground pin voltage. As a result, the gate-source threshold voltage Vgs (for NMOS transistor T5) and base-emitter voltage Vbe (for BJT transistor T5') will increase, thereby reducing likelihood and magnitude of ESD device triggering and degradation in the device performance as described previously. According to the teachings of the present disclosure, bias voltages (Vbias) may optionally be implemented as being switchable. In this case, optional switches (S6, S7) may be implemented. Such switches may selectively be in the OFF or ON state to switch in or out the corresponding bias voltages. In a preferred embodiment, bias voltages (Vbias) are permanently applied.

Figure 4D:
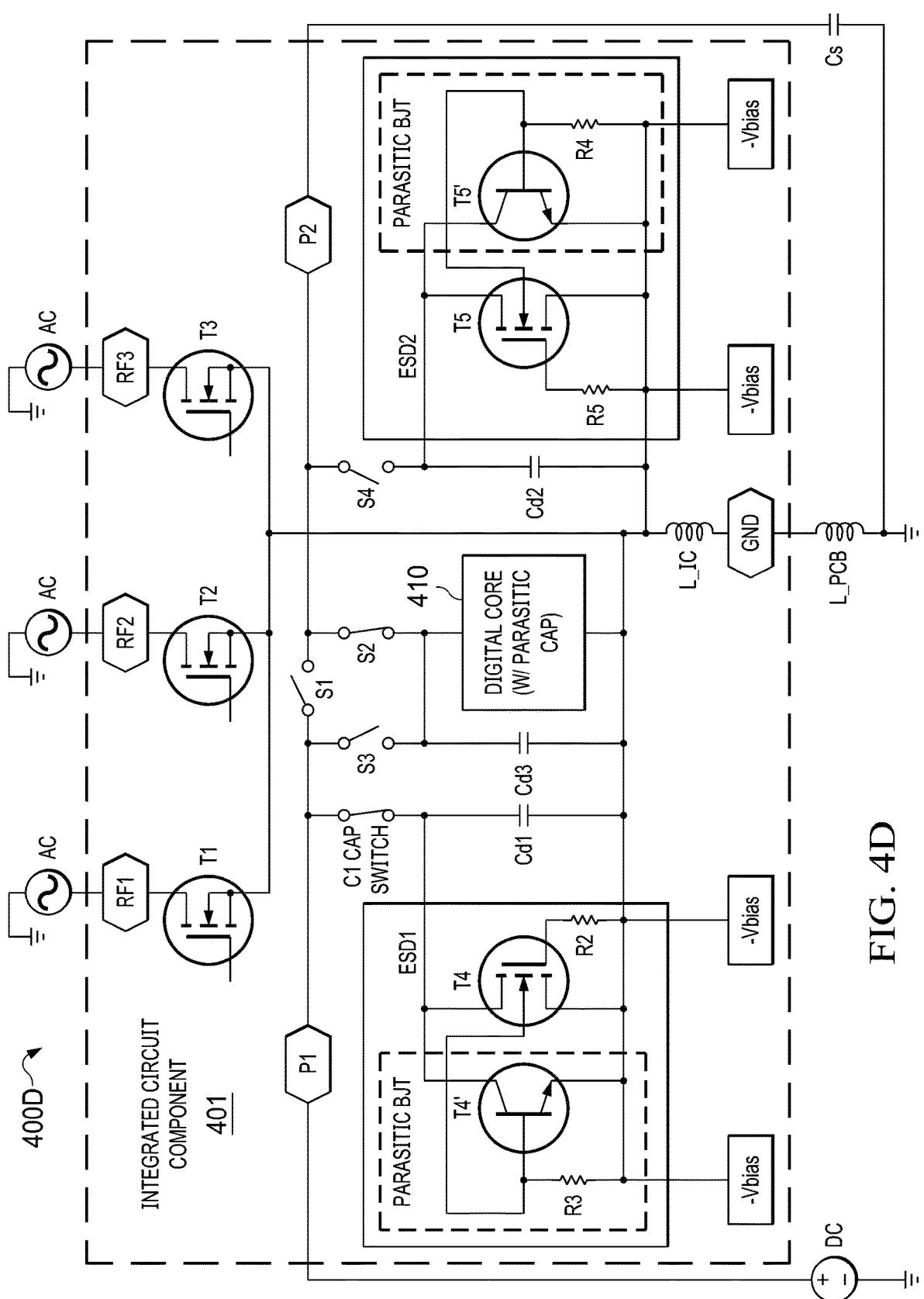

According to the teachings of the present disclosure, combinations of various solutions addressed above may also be envisaged. As an example, FIG. 4D shows an example circuital arrangement (400D) in accordance with an embodiment of the present disclosure, where both switch (S4) and bias voltages (Vbias) are implemented to further address the resonance issues as described throughout the disclosure. Again, as described above with regards to the embodiment of FIG. 4C, bias voltages (Vbias) may be switchable by implementing series switches (not shown here) as described previously.

Figure 4E:
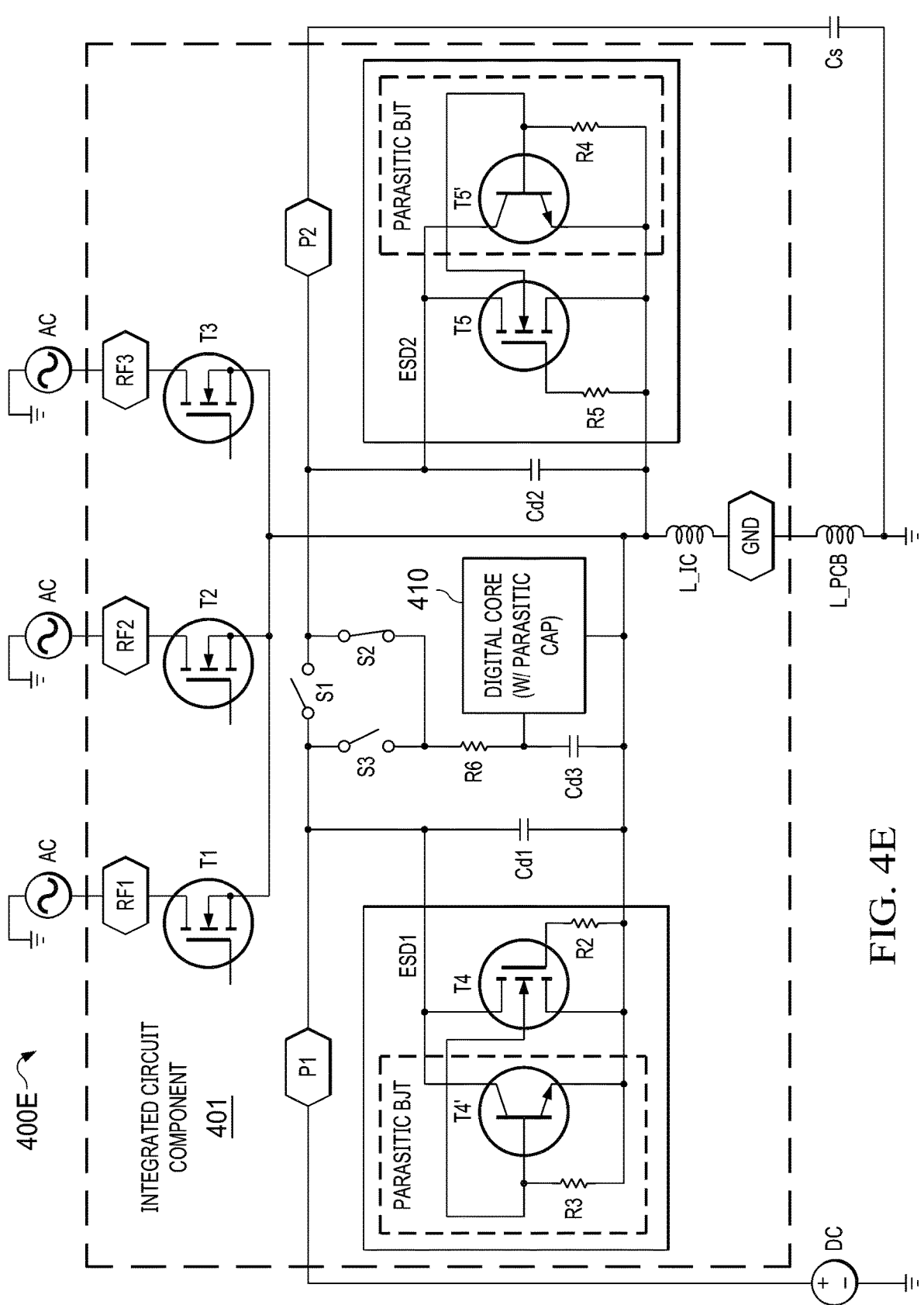

FIG. 4E shows an example circuital arrangement (400E) in accordance with an embodiment of the present disclosure. Circuital arrangement (400E) represents a portion of an RF system and is similar to the circuital arrangement (400A) of FIG. 4A except for the addition of resistor (R6), disposed in the IC (401), connecting pins (P1 or P2) to digital core (410). The advantageous impact of adding such resistor is to both i) shift the frequency of the undesired resonance and ii) spread the RF impedance increase across wider frequency range, resulting in an overall device performance. Stated differently, the function of the additional resistor (R6) is to de-Q analog and digital core capacitances to minimize their contribution to the undesired resonance issue.

As stated previously, with reference to the embodiments of FIGS. 4B-4E, various combinations of the presented solution are possible, depending on the application. As an example, depending on the application, the designer may choose to implement the de-Qing resistor (R6) with bias voltages (Vbias) or the switch (S4) or with both.

With reference to the embodiments of FIGS. 4B-4E, in some applications, pins (P1, P2) may be swappable. While in the embodiments shown storage capacitor (Cs) is connected to pin (P2), in a different embodiment a distinct arrangement can be envisioned, i.e. storage capacitor (Cs) may be connected to pin (P1) and I/O elements to pin (P1). In this case, instead of applying the presented solutions to ESD device (ESD2), such solutions are applied to ESD device (ESD1) in a similar fashion.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for case of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A circuital arrangement comprising an integrated circuit (IC), comprising:
   one or more shunt switches coupled to a first pin of the IC;
   a first electrostatic discharge protection device disposed inside the IC and coupled to the first pin of the IC;
   a first decoupling capacitor coupled across the first electrostatic discharge protection device;
   a storage capacitance disposed outside the IC and coupled to the first pin of the IC,
   wherein:
   the storage capacitance is configured as an alternating current (AC)-short circuit across an operational frequency band of the IC;
   a combination of the first electrostatic discharge protection device and the first decoupling capacitor is selectively switchable in and out; and
   when the combination of the first electrostatic discharge protection device and the first decoupling capacitor is switched out, the circuital arrangement is configured to attenuate a parasitic resonance formed when the combination of the first electrostatic discharge protection device and the first decoupling capacitor is switched in, by a combination of i) a series arrangement of a parasitic ground inductance inside the IC and a parasitic ground inductance outside the IC with ii) a parallel arrangement of the first decoupling capacitance and a parasitic capacitance, the parasitic resonance to be canceled or reduced occurring at a frequency within an operational frequency band of the circuital arrangement.

2. The circuital arrangement of claim 1, wherein the combination of the first electrostatic discharge protection device and the first decoupling capacitor is coupled to the first pin of the IC through a first switch.

3. The circuital arrangement of claim 1, further comprising input/output (I/O) devices outside the IC, connected to the first pin.

4. The circuital arrangement of claim 3, wherein the IC comprises a second pin configured to receive a bias voltage.

5. The circuital arrangement of claim 4, further comprising a second electrostatic discharge protection device, the second electrostatic discharge protection device being disposed inside the IC and coupled to the second pin of the IC.

6. The circuital arrangement of claim 5, further comprising a second decoupling capacitor coupled across the second electrostatic discharge protection device.

7. The circuital arrangement of claim 6, further comprising a digital core disposed inside the IC, coupled to the first and the second pin.

8. The circuital arrangement of claim 7, wherein the parasitic capacitance includes parasitic capacitances of the first electrostatic discharge protection device, the second electrostatic discharge protection device, and the digital core.

9. The circuital arrangement of claim 1, wherein the IC is disposed on a printed circuit board (PCB), and wherein the parasitic ground inductance outside the IC is a PCB ground impedance.

10. A circuital arrangement comprising an integrated circuit (IC), comprising:

one or more shunt switches coupled to a first pin of the IC;

a first electrostatic discharge protection device, the first electrostatic discharge protection device being disposed inside the IC and coupled to a first pin of the IC;

a first decoupling capacitor coupled across the first electrostatic discharge protection device;

a storage capacitance disposed outside the IC and coupled to the first pin of the IC;

wherein:

the storage capacitance is configured as an alternating current (AC)-short circuit across an operational frequency band of the IC;

the first electrostatic discharge protection device includes a first transistor connected to a second transistor, the first transistor being a field-effect transistor (FET) and the second transistor being a bipolar junction transistor (BJT), and a gate terminal of the FET and a base terminal of the BJT are configured to receive a negative bias voltage.

11. The circuital arrangement of claim 10, wherein:

the gate terminal of the first transistor is connected to the base terminal of the second transistor;

a drain terminal of the first transistor is connected to a collector terminal of the second transistor, and a source terminal of the first transistor is connected to an emitter terminal of the second transistor.

12. The circuital arrangement of claim 10, wherein:

a combination of the first electrostatic discharge protection device and the first decoupling capacitor is selectively switchable in and out, and when the combination of the first electrostatic discharge protection device and the first decoupling capacitor is switched out, the circuital arrangement is configured to attenuate a parasitic resonance formed when the combination of the first electrostatic discharge protection device and the first decoupling capacitor is switched in, by a combination of i) a series arrangement of a parasitic ground inductance inside the IC and a parasitic ground inductance outside the IC with ii) a parallel arrangement of the first decoupling capacitance and a parasitic capacitance, the parasitic resonance to be canceled or reduced occurring at a frequency within an operational frequency band of the circuital arrangement.

13. The circuital arrangement of claim 10, further comprising input/output (I/O) devices outside the IC connected to the first pin.

14. The circuital arrangement of claim 13, wherein the IC further comprises a second pin (P1) configured to receive a bias voltage.

15. The circuital arrangement of claim 14, further comprising a second electrostatic discharge protection device, the second electrostatic discharge protection device being disposed inside the IC and coupled to the second pin of the IC.

16. The circuital arrangement of claim 15, further comprising a second decoupling capacitor (Cd1) coupled across the second electrostatic discharge protection device.

17. The circuital arrangement of claim 16, wherein the IC further comprises a digital core coupled to the first and the second pin.

18. The circuital arrangement of claim 17, further including parasitic capacitances including parasitic capacitances of the first electrostatic discharge protection device, the second electrostatic digital protection device, and the digital core.

19. A circuital arrangement comprising an integrated circuit (IC), comprising:

one or more shunt switches coupled to a first pin of the IC;

a first electrostatic discharge protection device, the first electrostatic discharge protection device being disposed inside the IC and coupled to the first pin of the IC;

a first decoupling capacitor coupled across the first electrostatic discharge protection device;

a storage capacitance disposed outside the IC and coupled to the first pin of the IC; and a digital core inside the IC, coupled to the first pin through a series resistor; the series resistor being disposed inside the IC and being served to attenuate a parasitic resonance formed by a combination of i) a series arrangement of a parasitic ground inductance inside the IC and a parasitic ground inductance outside the IC with ii) a parallel arrangement of the first decoupling capacitance and a parasitic capacitance, the parasitic resonance to be canceled or reduced occurring at a frequency within an operational frequency band of the circuital arrangement.

20. The circuital arrangement of claim 19, further comprising a second electrostatic discharge protection device, the second electrostatic discharge protection device being disposed inside the IC and coupled to a second pin of the IC.

21. The circuital arrangement of claim 20, further comprising a second decoupling capacitor coupled across the second electrostatic discharge protection device.

22. The circuital arrangement of claim 19, further including a second electrostatic digital protection device, and wherein the parasitic capacitance includes parasitic capacitances of the first electrostatic discharge protection device, the second electrostatic digital protection device, and the digital core.

* * * * *